US006696871B2

(12) United States Patent
Bienvenu et al.

(10) Patent No.: US 6,696,871 B2
(45) Date of Patent: *Feb. 24, 2004

(54) CIRCUIT FOR CONTROLLING A POWER MOS TRANSISTOR AND DETECTING A LOAD IN SERIES WITH THE TRANSISTOR

(75) Inventors: Philippe Bienvenu, Allauch (FR); Antoine Pavlin, Puyricard (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/165,088

(22) Filed: Jun. 6, 2002

(65) Prior Publication Data

US 2002/0149415 A1 Oct. 17, 2002

Related U.S. Application Data

(63) Continuation of application No. 09/619,565, filed on Jul. 19, 2000, now Pat. No. 6,483,370.

(30) Foreign Application Priority Data

Jul. 20, 1999 (FR) .............................................. 99 09562

(51) Int. Cl.[7] ................................................. H03K 4/06
(52) U.S. Cl. ........................ 327/134; 327/442; 327/387; 327/427
(58) Field of Search ................................. 327/134, 427, 327/170, 345, 442, 108, 387; 363/56, 127

(56) References Cited

U.S. PATENT DOCUMENTS

| 4,928,220 A | * | 5/1990 | White ........................ 363/56 |
| 5,015,921 A | * | 5/1991 | Carlson et al. ............. 315/208 |
| 5,164,659 A | | 11/1992 | Schultz et al. .............. 323/351 |
| 5,663,667 A | | 9/1997 | Blum et al. .................. 327/134 |
| 5,828,308 A | * | 10/1998 | Fukami ....................... 340/664 |
| 5,903,173 A | | 5/1999 | Gottshall et al. ........... 327/108 |
| 5,963,406 A | | 10/1999 | Neiger et al. ................. 361/42 |
| 6,038,154 A | * | 3/2000 | Boylan et al. .............. 363/127 |
| 6,157,176 A | | 12/2000 | Pulvirenti et al. .......... 323/266 |

FOREIGN PATENT DOCUMENTS

| EP | 0 709 961 | 5/1996 |
| EP | 0 763 746 | 3/1997 |

* cited by examiner

*Primary Examiner*—Tuan T. Lam
*Assistant Examiner*—Hiep Nguyen
(74) *Attorney, Agent, or Firm*—Lisa K. Jorgenson; E. Russell Tarleton; Seed IP Law Group PLLC

(57) ABSTRACT

The detection of the presence of a load associated with a power MOS transistor integrated with its control circuit using a filtering time delay in generating a detection signal with respect to the occurrence of a turn-off control order of the power transistor, and where the filtering time delay is controlled with the power transistor switching time.

16 Claims, 5 Drawing Sheets

CIRCUIT FOR CONTROLLING A POWER MOS TRANSISTOR AND DETECTING A LOAD IN SERIES WITH THE TRANSISTOR

TECHNICAL FIELD

The present invention relates to circuits integrating a power MOS transistor with its control circuit, and more particularly to a control circuit with load detection for a high-frequency switching power MOS transistor.

BACKGROUND OF THE INVENTION

FIG. 1 very schematically shows a conventional example of an integrated circuit of the type to which the present invention relates. Integrated circuit 1 essentially includes a power MOS transistor 2, the drain d and the source s of which define terminals, respectively 3 and 4 of the integrated circuit in communication with the outside. Terminal 3 corresponds to a terminal on which a voltage for supplying the load controlled by circuit 1 is applied. Terminal 4 corresponds to an output terminal intended for connection to a first terminal of the load to be controlled, the other terminal of the load being generally grounded. Transistor 2 is controlled by a circuit 5 (CTRL), and output terminal of which is connected to gate g of transistor 2. Circuit 5 generally includes several input terminals (symbolized by a multiple-wire connection 6) and/or terminals for parameterizing the circuit operation.

Most often, in the use of a circuit 1 such as illustrated in FIG. 1, it is also desired to detect the presence of the load in the circuit. For this purpose, circuit 1 further includes a terminal 7 intended for providing the result of a load presence detection performed within circuit 1 by a block 8 (DET).

FIG. 2 shows, in the form of block diagrams, an example of assembly of an integrated circuit 1 such as illustrated in FIG. 1 to control a load 10 (Q). Load 10 is series-connected with transistor 2 (not shown in FIG. 2) of circuit 1, that is, terminal 3 is connected to a positive supply terminal for application of a voltage Vbat, and terminal 4 is connected to a first terminal of load 10, a second terminal of which is connected to ground m. In the example of FIG. 2, the assembly provides the function of detecting the presence of the load 10 between terminals 4 and m. The present invention more specifically applies to the load detection and, more precisely, to the detection of the presence of the unsupplied load (that is, with transistor 2 in the off state).

To detect the presence of a load 10 in the assembly while said load is not supplied, a resistor Rp is provided in parallel with transistor 2. In other words, resistor Rp is connected, most often externally to circuit 1, between terminals 3 and 4. With such an assembly, if the load is present, terminal 4 is at a potential corresponding to the ground when transistor 2 is on. If the load is absent, that is, terminal 4 is floating, this terminal is at a positive potential, here potential Vbat, minus the voltage drop in resistor Rp. The value of resistor Rp generally is several kilo-ohms to avoid generating too high a consumption or strongly dissipating.

Generally, and especially if the value of voltage Vbat is different from the low supply voltage of detection circuit 8, resistor Rp is connected between terminal 4 and a terminal (not shown) of application of a biasing voltage Vpol (for example, 5 volts).

Exploiting the measurement of the voltage on terminal 4 by resistor Rp raises several problems.

A first problem is due to the switching time of transistor 2. This problem is illustrated by FIG. 3A, which shows in the form of a timing diagram an example of the shape of the output voltage V4 of circuit 1 for supplying a load Q.

This example relates to a turn-on control at a time t0 that translates as a voltage V4 reaching voltage level Vbat (neglecting the series voltage drop in transistor 2 in the on state) at a time t1. The difference between times t0 and t1 represents the turn-on switching time of transistor 2. In the example of FIG. 3A, it is assumed that at a time t2, circuit 5 turns off transistor 2. This turn-off control translates, from a time t3, as a decrease of voltage V4 until said voltage is annulled at a time t4. The time interval between times t2 and t3 corresponds to the response time (tdoff) of the transistor, that is, the delay of its switching with respect to the received control signal. The time interval between times t3 and t4 corresponds to the off time of the transistor (tf), generally given as being the time of decrease of the voltage on terminal 4 from 90% to 10% of voltage Vbat.

The detection of the presence of a load in series with transistor 2 can, in the off state, be polluted by the off switching time of the transistor. Indeed, in exploiting the measurement of the potential of source s of transistor 2 between times t2 and t4, the absence of a load will be detected, even if said load is present. This is due to the fact that the off state of the transistor is detected from time t2 when the control circuit has sent the turn-off order, but that the disappearing of the potential on terminal 4 when a load is present only occurs at the end of the switching time.

Accordingly, the exploitation of the measurement has to be delayed with respect to time t2 of the turn-off control. This delay is most often performed by a capacitive filter. The filtering time must then be adapted to the transistor switching time.

Another problem that is raised in exploiting this voltage detection to determine the presence or the absence of a load while the circuit is off is that the transistor switching time depends on supply voltage Vbat of the assembly. Accordingly, a filtering time corresponding to the worst possible case of the assembly has to be provided. This situation is illustrated in FIG. 3B that illustrates, in the form of timing diagrams, the shape of a signal for controlling the exploitation of the measurement. This signal illustrates the necessary filtering delay. In the example of FIGS. 3A and 3B, it is assumed that as long as control signal Vf illustrated in FIG. 3B is high, the reading of the measurement voltage cannot be performed. Accordingly, this signal is high during the entire period (t0–t2) when the transistor is on, since the presence of the load is then detected by other means (current measurement), and between time t2 and a time t5 representing the necessary filtering delay after the transistor turn-off order. As illustrated in FIG. 3B, it is generally necessary, to guarantee a proper detection, to take a filtering delay (t2–t5) greater than the minimum filtering delay (times t2 to t6) itself corresponding to the worst off switching case of transistor 2 (illustrated by the dotted lines in FIG. 3A).

All these precautions often result in extended filtering times that, in some applications, even prevent the detection of the absence of a load. Such is the case, for example, if integrated circuit 1 is used to control transistor 2 at frequencies on the order of one kilohertz, which is a usual value in pulse-width modulation applications (PWM). In such applications, the absence of a load can then no longer be detected since the security margin to be taken on the filtering delay is not negligible, or may even exceed the period of the signal controlling the transistor to the on state.

SUMMARY OF THE INVENTION

The disclosed embodiments of the present invention provide a novel circuit for detecting the presence of a load that overcomes the disadvantages of known circuits and enables reliable detection of the presence of a load.

While a first solution would be to reduce the switching time of the circuit power transistor, such a solution would not be fully satisfactory, since reducing the switching time of a power MOS transistor inevitably results in increasing the switching noise. Accordingly, this solution generates a noise problem, which is most often not desirable.

The present invention thus also provides a solution that is compatible with the other circuit operation requirements and, in particular, with a need for low switching noise.

The present invention provides reducing the filtering time to the smallest possible value. For this purpose, the present invention provides making the filtering time self-adaptive according to the circuit supply voltage.

More specifically, the present invention provides an integrated circuit for controlling a power MOS transistor, including a circuit for detecting the presence of an external load, using filtering means for delaying a time of taking the detection into account with respect to the occurrence of a turn-on control signal of the power transistor, and means for controlling the filtering time with the switching time of the power transistor.

According to an embodiment of the present invention, where the switching times of the power transistor can be parameterized by the charge/discharge of a first capacitor by a first constant current source, said filtering means include a second constant current source for discharging a filtering capacitor, the value of the constant current of the second source being proportional to the value of the constant current of the first source.

According to an embodiment of the present invention, the circuit includes means for making a voltage of precharge of the second capacitor proportional to the initial or final voltage across the first capacitor upon switching of the power transistor.

The present invention also provides a method for detecting the presence of a load in series with a power transistor integrated with its control circuit, consisting of making a filtering time of detection of the output voltage of the integrated circuit dependent on the switching time of the power transistor.

According to an embodiment of the present invention, the method consists of controlling the discharge current of a filtering capacitor with the value of a charge current of a capacitor for parameterizing the switching time of the power transistor, and of making the precharge voltage of the filtering capacitor proportional to the integrated circuit supply voltage.

The present invention further relates to a circuit for detecting the presence of a load in series with a power transistor integrated with its control circuit, this detection circuit including a filtering cell adapted to controlling the time of taking the detection into account with the switching time of the power transistor.

According to an embodiment of the present invention, said filtering cell includes a capacitor associated with a current source adapted to discharging the capacitor under a constant current, this constant current being made proportional to a constant current determining the switching time of the transistor.

According to an embodiment of the present invention, the detection circuit includes means for determining a minimum filtering time.

According to an embodiment of the present invention, said filtering cell includes a resistive dividing bridge connected in parallel with the external load, the midpoint of the dividing bridge being connected, via a diode, to a first terminal of the filtering capacitor connected on an input terminal of an inverter, the output terminal of which provides the result of the detection, a second terminal of the filtering capacitor being grounded.

The foregoing objects, features and advantages of the present invention will be discussed in detail in the following non-limiting description of specific embodiments in connection with the accompanying drawings.

DETAILED DESCRIPTION OF THE INVENTION

Figure 1:
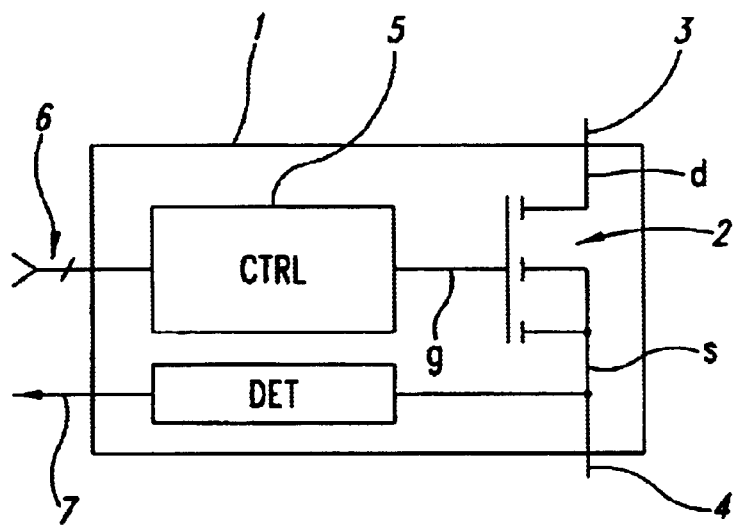
FIGS. 1, 2, 3A, and 3B, previously described, are intended for showing the state of the art and the problem to solve.
Figure 2:
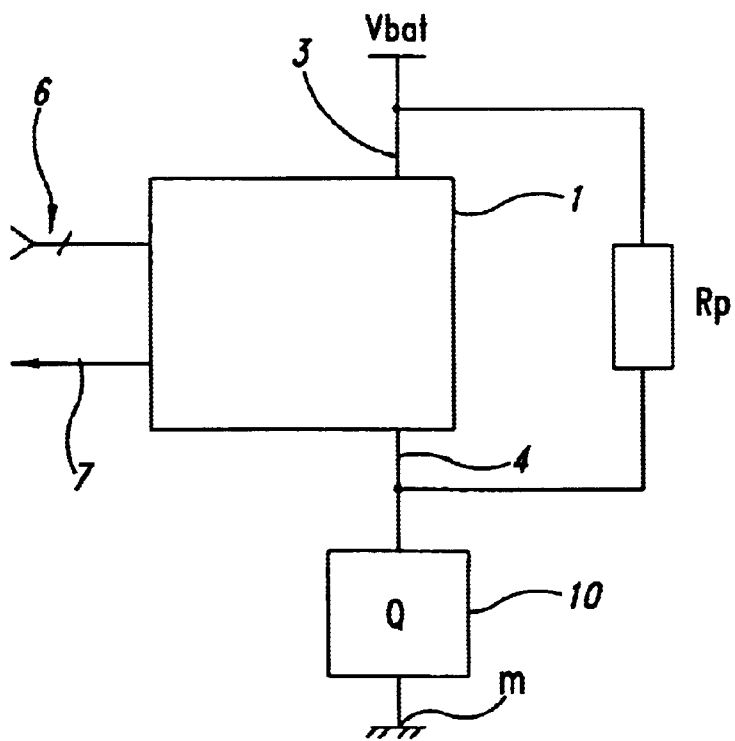

The same elements have been designated with the same references in the different drawings. For clarity, the timing diagrams are not to scale and only those elements that are necessary to the understanding of the present invention have been shown in the drawings and will be described hereafter. In particular, the control circuit of the power MOS transistor and the circuit for exploiting the measurement of detection of the presence of a load have not been detailed.

The present invention takes advantage of the fact that, in integrated circuits for controlling a power MOS transistor, the possibility of adapting the transistor switching time is generally provided. This adaptation is provided to enable either the manufacturer or the user to parameterize the switching time according to the application.

To perform such an adaptation, a constant current source internal to the integrated circuit is used and the transistor switching time is adjusted by adapting the value of a capacitor (internal or external according to whether the adaptation is performed by the integrated circuit manufacturer or by the user).

Figure 4:
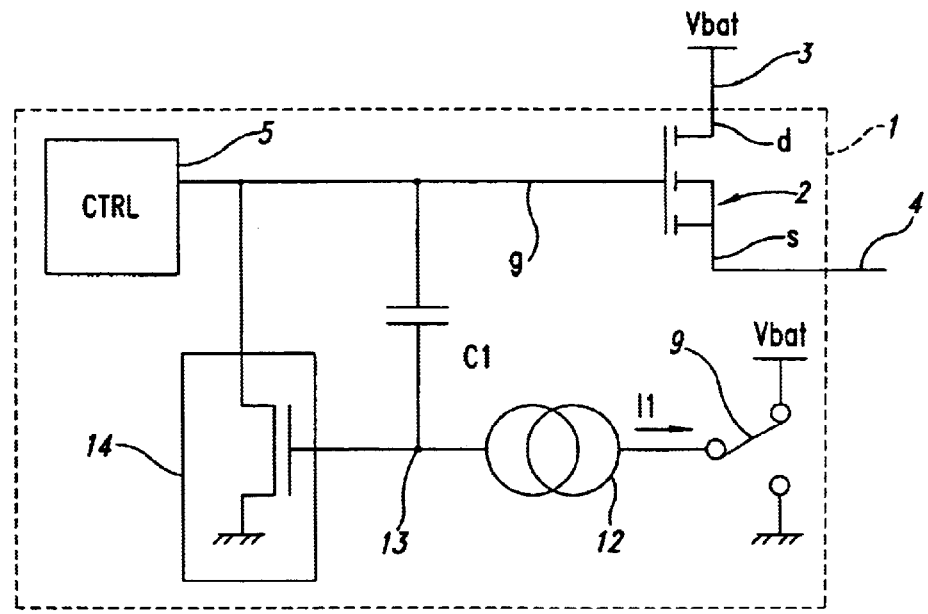
FIG. 4 very schematically shows in the form of blocks an integrated circuit of control of a MOS transistor, provided with means for determining the switching time of this transistor.

FIG. 4 shows, in the form of block diagrams, an integrated circuit 1 for controlling a MOS transistor 2 of the type to which the present invention applies, equipped with means for adjusting the transistor switching time. Generally, circuit 5 (CTRL) sending a control signal onto control gate g of transistor 2 includes a charge pump circuit (not shown). To adjust the switching time, a capacitor C1 having a first terminal connected to gate g of transistor 2 and a second terminal 13 connected to a current source 12 is used. Current source 12 is a constant current source that, by means of a switch 9, is either supplied by supply voltage Vbat of circuit 1, or grounded. The control (not shown) of switch 9 is conventionally synchronized with the control of transistor 2.

Terminal 13 is also connected to a circuit 14 for controlling the charge of gate g. This control circuit is, for example, formed of a MOS transistor connected between gate g and the ground and the gate of which is connected to node 13.

Figures 3A, 3B:
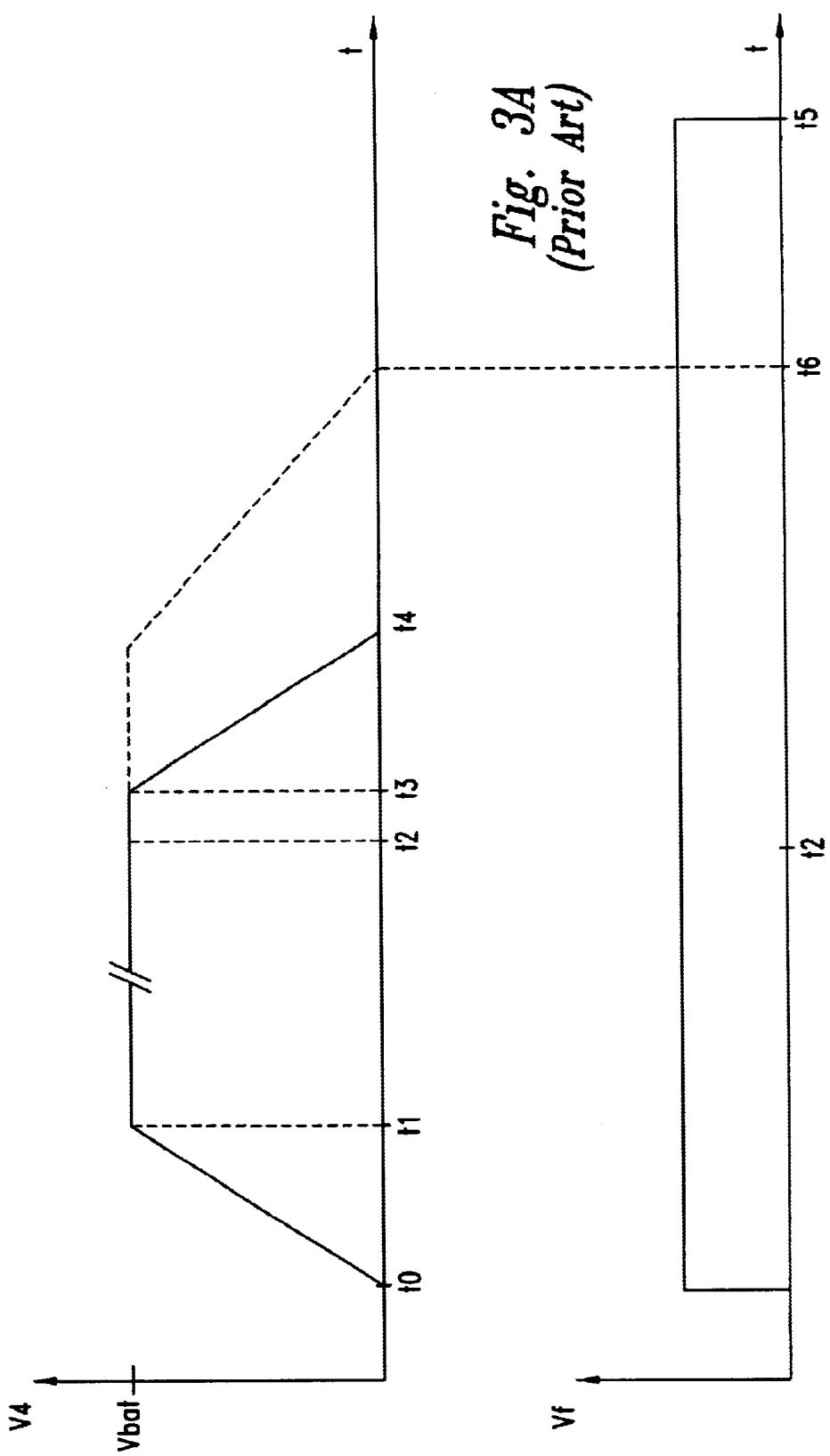

The adjusting of the off and on switching times uses the principle of the charge/discharge of capacitor C1 by current source 12. The potential of node 13 is substantially constant since it is connected to the gate of the MOS transistor constitutive of circuit 14. The duration of the switching time (interval t2–t4 or t2–t6 in FIG. 3A) is provided by relation V1.C1/I1, where I1 represents the constant current of source 12 and V1 represents the initial (turn-off) or final (turn-on) voltage across capacitor C1.

The charge pump circuit of block 5 aims, upon turning-on of transistor 2, to bring the potential of its gate g to a potential greater than that of its source s. The potential variation across capacitor C1 (initially discharged) is then such that the current flows, in source 12, from terminal 13 to the ground. Since source 12 is a constant current source, the charge time of capacitor C1 depends on the value of voltage Vbat. The function of MOS transistor 14 is to control the voltage variation across capacitor C1 by making the potential at node 13 substantially constant and thus to control the charge rate of the gate of transistor 2.

The turnoff control of transistor 2 consists of annulling the signal sent by block 5 to annul the gate voltage of transistor 2. This gate voltage however takes, to be annulled, the time necessary to discharge capacitor C1. This discharge is performed through transistor 14 under a constant current determined by source 12 (from terminal Vbat to terminal 13). Transistor 14 absorbs the current of capacitor C1 determined by source 12 and the gate current of transistor 2.

Adjusting the switching time by modifying the capacitance of capacitor C1 is a generally preferred embodiment in this type of circuit. It should however be noted that as an alternative, the capacitance of a capacitor connected between node 13 and source s of transistor 2 may be modified. The essential difference then is that a variation of the value of the capacitor not only acts upon the decrease time (tf) but also upon the response time (tdoff or tdon). The shape of the curve obtained in the switching then is less linear than in the case of a variation of the capacitance of capacitor C1, where the variation is then similar to that illustrated in FIG. 3A.

In some cases it may be desired to modify the switching times, to vary the value of the current in source 12 rather than that of the capacitor. However, it is generally preferred to vary the capacitance of capacitor C1, which variation has less effect than source 12 formed of transistors upon the formation of the integrated circuit.

A feature of the present invention is to make the filtering time of a load detection circuit dependent on the switching time. In other words, the present invention aims at making the filtering time self-adaptive according to the switching time variations.

According to a preferred embodiment of the present invention, this control of the filtering time by the switching time is performed by using a constant current source having a value proportional to the current in source 12 and a filtering capacitor having a value proportional to the value of capacitor C1.

Another feature of the present invention is to cause a precharge of the capacitor of the filtering cell to a voltage proportional to the voltage across capacitor C1 upon switchings, that is, dependent on voltage Vbat.

Figure 5:
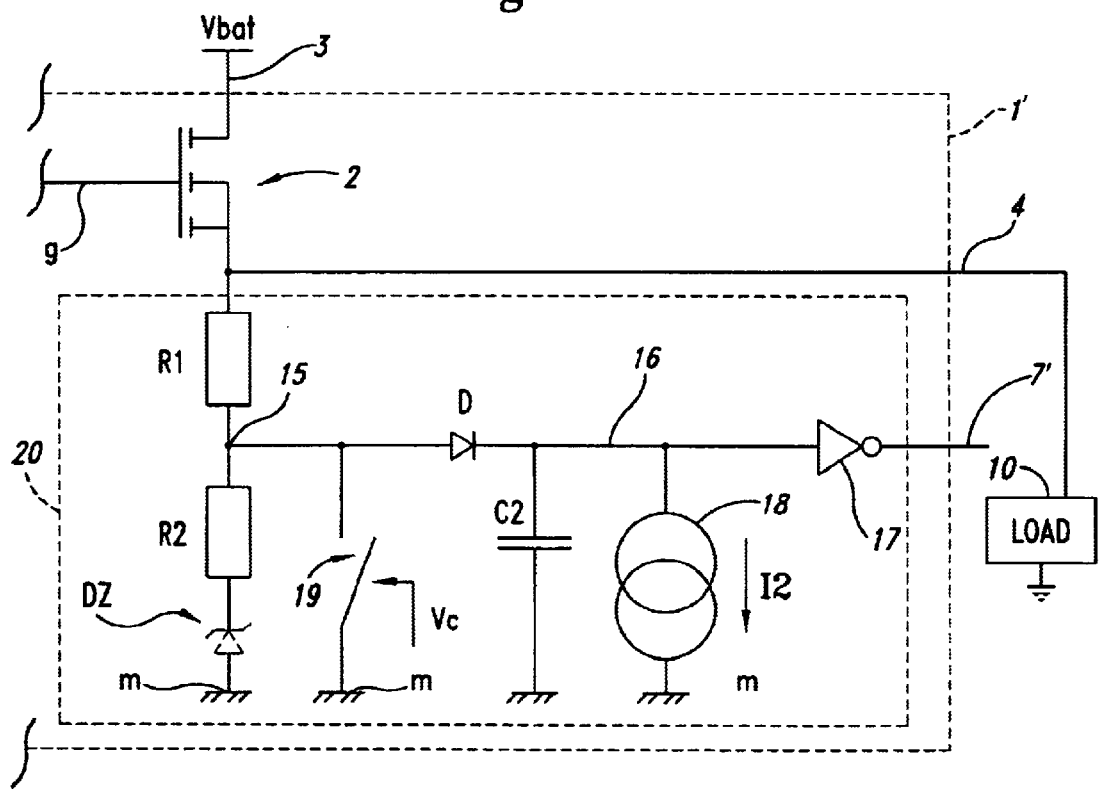
FIG. 5 shows a first embodiment of a circuit for adapting the filtering time according to the present invention.

FIG. 5 shows an embodiment of a load detection circuit according to the present invention. This circuit is preferably integrated with the rest of the control elements of transistor 2 and with the latter in a circuit 1'. For simplification, the representation of circuit 1' in FIG. 5 is only partial. In particular, the control elements of transistor 2 that are illustrated in FIG. 4 have not been shown.

According to the present invention, a filtering cell 20, an output 7 of which provides a logic state indicative of the voltage level of the source of transistor 2, is provided in parallel with the load, that is, between terminal 4 and ground m. This cell includes, between terminal 4 and ground m, a resistive dividing bridge formed of resistors R1, R2. The midpoint 15 of the resistive dividing bridge is connected to the anode of a diode D, the cathode 16 of which is connected to an input of an inverter 17. The inverter output forms a terminal 7' providing the result of the detection. A capacitor C2 is connected in parallel with a constant current source 18 between terminal 16 and ground m. Further, a switch 19 grounds terminal 15 (the anode of diode D). Switch 19 is controlled by a signal Vc coming from control circuit 5 and is intended to stop the precharge of capacitor C2 at the turn-off control of capacitor 2, to then start the discharge of capacitor C2.

A current source 18 is formed to provide a constant current 12, proportional to current 11 of source 12 (FIG. 4). Since both current sources are in the form of an integrated circuit, the respective sizes of the MOS transistors of these sources may be adapted according to a first embodiment of the present invention to obtain equal or proportional currents. However, according to a second embodiment of the present invention, current source 18 will be obtained from one or several transistors mounted as a current mirror on a transistor constitutive of source 12. An advantage of this second embodiment is that the possible parasitic variations of current sources 12 and 18 are thus correlated.

The value of the precharge voltage of capacitor C2 depends on the values of resistances R1 and R2 determining the proportionality coefficient between the charge voltage of capacitor C2 and voltage Vout. This coefficient determines the maximum limiting precharge value of capacitor C2. However, said capacitor may be precharged to a smaller value by the turning-on of switch 19 under control of signal Vc. Accordingly, the precharge voltage of capacitor C2 may correspond to voltage Vout (very low resistance R1 as compared to resistance R2), to a fraction of this output voltage, or to a fixed threshold, for example, by measuring the voltage across capacitor C2 to turn on switch 19 when this threshold is reached. The function of diode D is to prevent the discharge of capacitor C2 into switch 19 when said switch is on.

Once precharged, capacitor C2 discharges into current source 18 with a constant current. Accordingly, the potential of cathode 16, which is initially in a high state when capacitor C2 is charged, will progressively decrease, to reach the ground once capacitor C2 is fully discharged. Inverter 17 enables shaping the signal to be provided on terminal 7' so that its respective rising and falling edges be clearly marked.

It is thus acknowledged that, if the value of current 12 is proportional to the value of current 11 of source 12 (FIG. 4), if the value of capacitor C2 is proportional to the value of capacitor C1, and if precharge voltage V2 of capacitor C2 is proportional to voltage V1 across capacitor C1 upon switchings, the switching time of inverter 17 with respect to a turn-off control of transistor 2 will follow the same variations as the off switching time of this transistor. The relation linking filtering time tC2 to switching time tC1 can be written as:

$$tC2=(Kv.Kc/Ki).tC1,$$

where Kv represents the ratio between voltages V2 and V1, Kc represents the ratio between the respective capacitances of capacitors C2 and C1, and Ki represents the ratio between currents I2 and I1 of respective sources 18 and 12.

Figure 6:
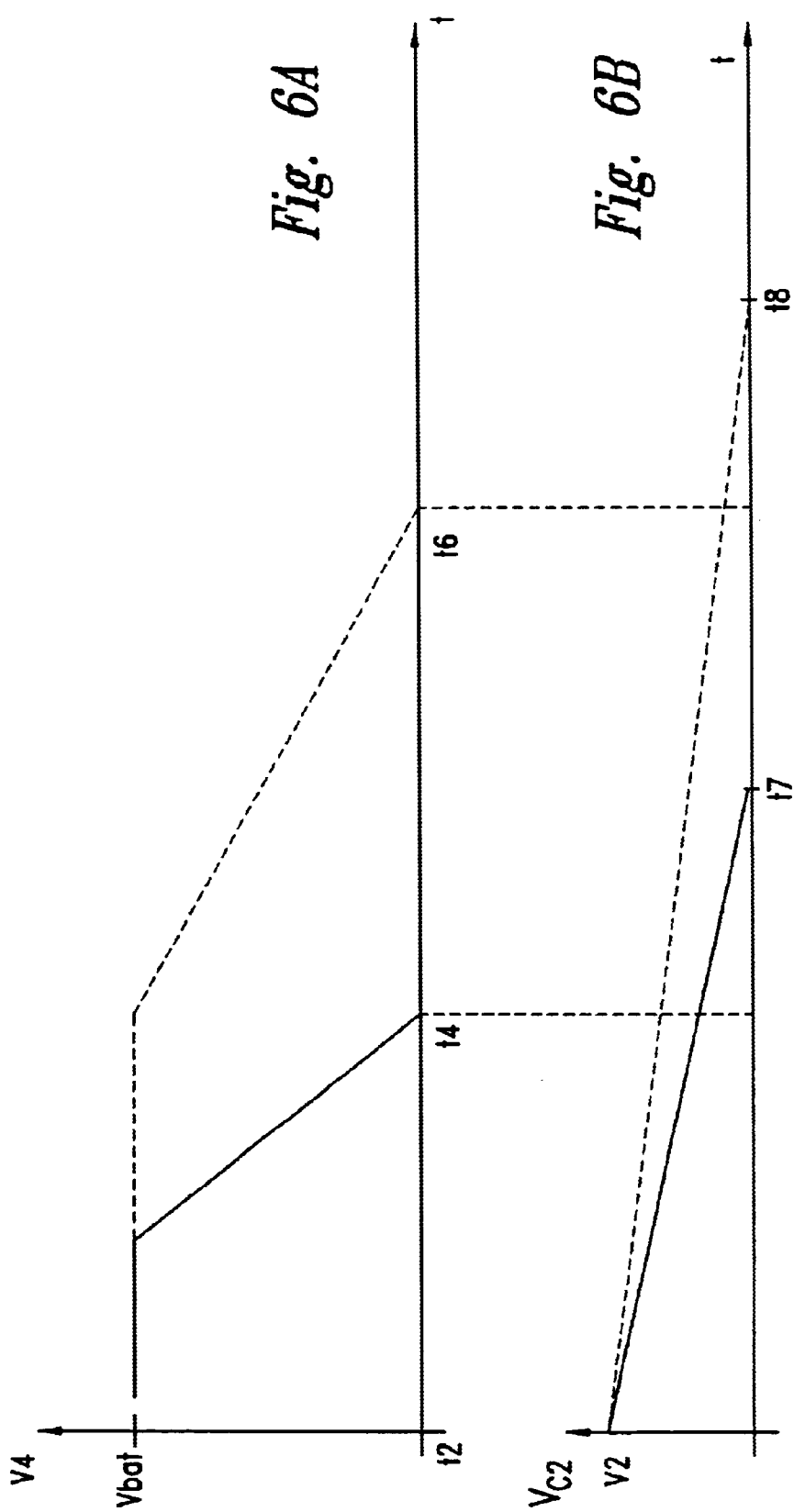
FIGS. 6A–B illustrate the application of the circuit of the present invention to detecting the presence of a load.

FIGS. 6A and 6B illustrate, in the form of timing diagrams, the operation of a circuit according to the present invention. FIG. 6A shows two examples of the shape of output voltage V4 upon switching off of transistor 2. FIG. 6B illustrates the corresponding shapes of voltage Vc2 illustrating the discharge of capacitor C2. In both cases, a turn-off control signal is assumed to be sent at a time t2. From this time t2 on, the capacitor discharges from precharge level V2. In the example of FIGS. 6A and 6B, it is indeed assumed that voltage Vbat is the same for the two switching examples. Accordingly, precharge level V2 is also the same in both cases. The full line illustrates a relatively fast switching between time t2 and time t4. The dotted line illustrates a relatively slow switching between time t2 and time t6. The curve of FIG. 6A is to be compared with the right-hand portion of FIG. 3A.

The example of FIG. 6B relates to a preferred embodiment of the present invention in which the proportionality coefficients between the respective voltages, currents and capacitances are such that Kv.Kc/Ki=1. This condition enables the variation of the filtering time illustrated by FIG. 6B for the two switchings of FIG. 6A to be exactly identical to the switching time variation. In FIG. 6B, the case where the circuit is parameterized so that voltage Vc2 annuls at a predetermined time t7, respectively t8 after respective times t4 and t6, to have a security margin ensuring the absence of any overlapping of the switching times, is illustrated. The duration of this security margin of course depends on the application and is within the abilities of those skilled in the art.

An advantage of the present invention is that it gets rid of the usual security margins to adapt the filtering time to the maximum admissible switching time according to the circuit supply voltages. Indeed, since the adaptation of the filtering time here is automatic according to a variation of voltage Vbat and of the other parameters determining the switching times, the security time margin (t4–t7) can be reduced to a minimum.

It may be desired to determine a minimum filtering time independent from the switching time conditions. For this purpose, it is sufficient to insert a zener diode DZ (shown in dotted lines in FIG. 5) in series with resistor R2 between terminal 15 and the ground. The threshold value of the zener diode then determines a minimum precharge voltage independent from the conditions of variation of supply voltage Vbat that conditions voltage V2 in the usual case.

Figure 7:
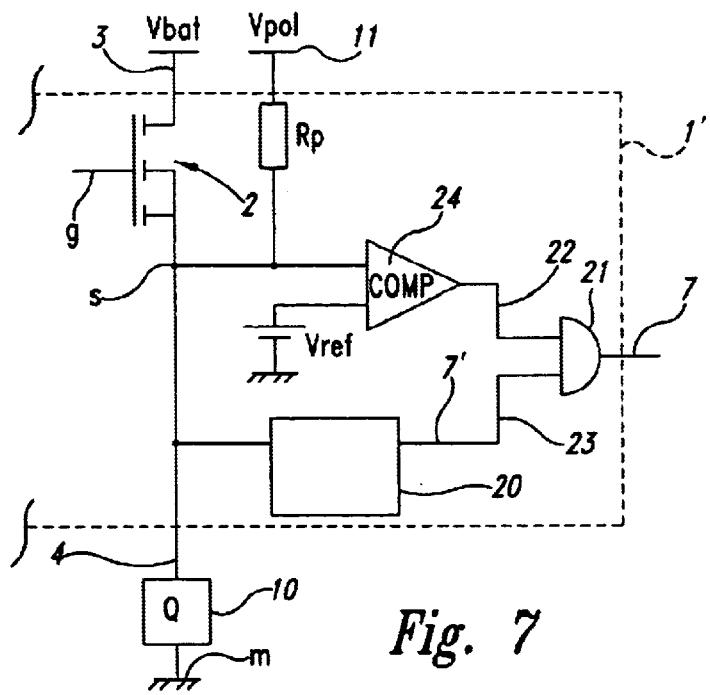
FIG. 7 shows a more detailed embodiment of a circuit according to the present invention.

FIG. 7 shows an embodiment of a circuit 1' according to the present invention exploiting a filtering cell 20 such as illustrated in FIG. 5 to provide on a terminal 7 a diagnostic on the presence or absence of a load 10 in series with transistor 2, between a terminal 3 providing a voltage Vbat and ground m. As in FIG. 5, the representation of FIG. 7 is partial.

Conventionally, to detect the presence of a load while switch 2 is open, a resistor Rp is provided between a terminal 11 of application of a biasing voltage (that may be voltage Vbat) and terminal 4. The function of this resistor is, conventionally still, to bring the potential of terminal 4 to value Vpol (minus the voltage drop in resistor Rp) in the case of an absence of load 10. If the load is present, terminal 4 is grounded.

The result of the determination of the presence of a load on terminal 7 is, in the example of FIG. 7, provided by a logic AND gate 21, a first input 22 of which receives the result of the comparison of the potential of terminal 4 with a reference voltage Vref and the second input 23 of which is connected to output 7' of a filtering cell 20 such as illustrated in FIG. 5. The signal of terminal 22 is provided by a comparator 24, a first input of which is connected to terminal 4 and a second input of which receives voltage Vref. The function of AND gate 21 is to only take into account the result of the detection by comparator 24 at the end of the time determined by filtering cell 20. Comparator 24 may be replaced with an inverter, which amounts to making the comparator switching threshold internal (in the middle of the supply voltage range).

In normal operation, that is, when circuit 1' is properly supplied, terminal 22 is permanently high so that the output state of gate 21 is only conditioned by the result provided by cell 20. As indicated previously, the operation of cell 20 being made dependent on the switching times of transistor 2, the switching of its output is performed, with certainty, at the proper time.

It should be noted that filtering cell 20 can be used indifferently to generate a delay at the turning-on of transistor 2 or at the turning-off of said transistor. Indeed, it is clear that the state of output 7' of cell 20 is delayed in the same way proportionally to the switching time of transistor 2 upon its turning-on. Accordingly, output signal 7' may also be used, according to the needs of the application, to exploit a turn-on result that is made reliable by the self-adaptation of the response of the filtering cell on the switching time.

Figure 8:
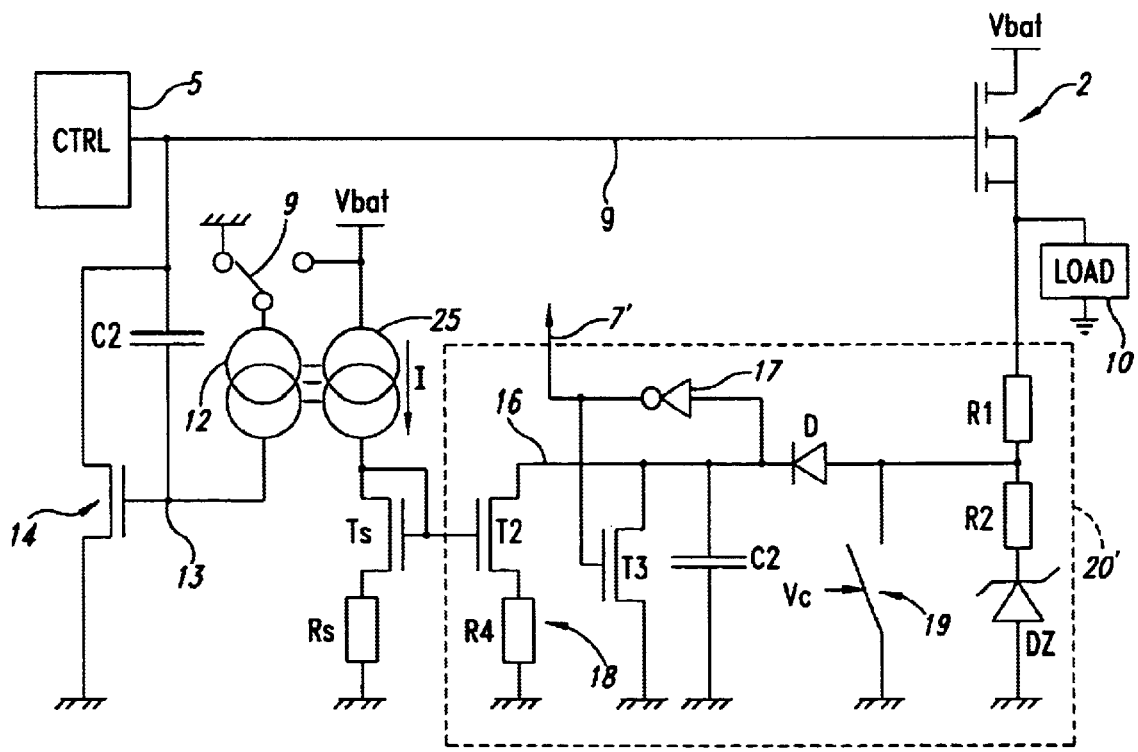
FIG. 8 shows a second embodiment of an integrated control circuit.

FIG. 8 shows a second embodiment of an integrated circuit of control of a power transistor 2, equipped with a filtering cell 20' according to the present invention.

According to the embodiment of FIG. 8, current source 18 of filtering cell 20' is obtained from a current source 25 mounted as a current mirror on source 12. Accordingly, a source 25 of constant current I has been shown, an output transistor Ts of which is intended for being mounted as a current mirror on a transistor T2 constitutive of current source 18. Transistor Ts is series-connected with a resistor Rs and source 25 between a terminal of application of voltage Vbat and ground m. Transistor T2 is series-connected with a resistor R4, between node 16 of cell 20' and the ground. Source 12 has been shown as in FIG. 4, that is, connected between node 13 and a switch 9 of selection between the ground and potential Vbat, to determine the current flow direction in source 12. The rest of the switching time adaptation circuit (capacitor C1, transistor 14 and current source 12) is similar to that described in relation with FIG. 4. It should here only be noted that the currents of sources 12 and 18 are perfectly correlated, ratio Ki depending on the respective values of the resistors in series with the transistors of these sources and on the respective gate width-to-length ratios of the transistors forming said sources.

Filtering cell 20' includes the same elements as described in relation with FIG. 5.

A feature of the embodiment of cell 20' of FIG. 8 is that a switch, for example, a MOS transistor T3, is connected in parallel with capacitor C2, the gate of transistor T3 being connected to terminal 7'. The function of transistor T3 is to force the discharge of capacitor C2 as soon as output 7' of cell 20' has switched. The reliability of the system is thus improved since it is ascertained that capacitor C2 is always initially discharged.

An advantage of the present invention is that it is now possible to use an integrated circuit such as illustrated in FIG. 4 and including a filtering cell such as illustrated in FIG. 5 or 8 to detect the presence of a load in series with power switch 2, even if said switch must be controlled at a relatively high frequency, for example, at a frequency of several tens of kilohertz in pulse-width modulation.

Of course, the present invention is likely to have various alterations, modifications, and improvements which will readily occur to those skilled in the art. In particular, the sizing of the different components of the filtering cell of the present invention is within the abilities of those skilled in the art according to the application and, in particular, according to the circuit supply voltage operating range. Further, although reference has been made in the foregoing description to an adaptation of the charge of capacitor C2 according to voltage Vbat, it should be noted that it is also possible to adapt the current provided by source 18 and to maintain precharge voltage V2 constant. Adapting the circuit of the present invention to implement such an alternative is within the abilities of those skilled in the art according to the functional indications given hereabove.

It should be noted that all the components of the filtering cell of the present invention may be made in the form of an integrated circuit. In particular, the different resistors (including resistor Rp) may have values compatible with the realization of polysilicon resistors. Further, the values of capacitors C1 and C2 are compatible with an integration.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit for controlling the on-off switching of a power MOS transistor in conjunction with the detection of an external load, comprising a detection circuit configured to detect the presence of the external load, the detection circuit comprising filtering means for delaying generation of a detection signal in response to the occurrence of a turn-on control signal to the power transistor, the detection circuit further comprising means for controlling a delay time of the filtering means to be dependent on an on-off switching time of the power MOS transistor, the switching times of the power MOS transistor are determined by the charge and discharge of a first capacitor by a first constant current source, said filtering means include a second constant current source for discharging a filtering capacitor, the value of the constant current of the second constant current source being proportional to the value of the constant current of the first constant current source.

2. The circuit of claim 1, further including means for making a voltage of precharge of a second capacitor proportional to the initial or final voltage across the first capacitor upon switching of the power transistor.

3. A circuit, comprising: a detection circuit coupled to a power transistor for detecting the presence of an external load in series with the power transistor integrated with its control circuit, the detection circuit comprising a filtering cell for delaying the time of generating a detection signal to be dependent on an on-off switching time of the power transistor, said filtering cell includes a capacitor associated with a current source adapted to discharging the capacitor under a constant current, this constant current being made proportional to a constant current determining the switching time of the transistor.

4. The circuit of claim 3, including means for determining a minimum time for generating the detection signal.

5. The circuit of claim 3 wherein said filtering cell includes a resistive dividing bridge connected in parallel with the external load, the midpoint of the dividing bridge being connected, via a diode, to a first terminal of the filtering capacitor connected on an input terminal of an inverter, the output terminal of which provides the detection signal, a second terminal of the filtering capacitor being grounded.

6. A circuit, comprising:
a power MOS transistor;
a control circuit coupled to the power MOS transistor, the control circuit comprising a first capacitor coupled to a first constant current source; and
a load detection circuit configured to detect the presence of a load in series with the power MOS transistor, the load detection circuit having a filtering circuit configured to make the time of generating a detection signal dependent on a switching time of the power MOS transistor wherein the filtering circuit comprises a filtering capacitor coupled to a second constant current source.

7. The circuit of claim 6 wherein the constant current of the second constant current source is proportional to a constant current of the first constant current source.

8. The circuit of claim 6 wherein the filtering capacitor discharge current is controlled by the value of a charge current of the first capacitor.

9. The circuit of claim 8 wherein the precharge voltage of the filtering capacitor is proportional to supply voltage.

10. A method for detecting a load in series with a power MOS transistor, comprising:
controlling a switching time of the power MOS transistor;
detecting the presence of a load in series with the power MOS transistor through a filtering circuit having a filtering time;
providing a first capacitor coupled to a first constant current source in a control circuit to determine the power MOS transistor switching time; and
providing a filtering capacitor coupled to a second constant current source in the filtering circuit.

11. The method of claim 10, further comprising configuring the second constant current source to provide a constant current that is proportional to a constant current of the first constant current source.

12. The method of claim 10, further comprising configuring the filter capacitor to have a discharge current that is controlled by the value of a charge current of the first capacitor.

13. The method of claim 12, further comprising configuring the filter capacitor to have a precharge voltage that is proportional to supply voltage.

14. An integrated circuit for controlling the on-off switching of a power MOS transistor in conjunction with the detection of an external load, comprising a detection circuit configured to detect the presence of the external load and to generate a detection signal in response thereto, the detection circuit comprising filtering means for delaying generation of the detection signal in response to occurrence of a turn-on control signal to the power transistor, the detection circuit further comprising means for controlling a delay time of the filtering means to be dependant on an on-off switching time of the power MOS transistor, wherein the switching times of the power MOS transistor are determined by the charge and discharge of a first capacitor by a first constant current source, the filtering means including a second constant current source for discharging a filtering capacitor, the value of the constant current of the second constant current source being proportional to the value of the constant current of the first constant current source.

15. A circuit, comprising: a detection circuit coupled to a power transistor for detecting the presence of an external load in series with the power transistor integrated with its control circuit and configured to generate a detection signal in response thereto, the detection circuit comprising a filtering cell for delaying the time of generating the detection signal to be dependant on an on-off switching time of the power transistor, the filtering cell comprising a capacitor associated with a current source adapted to discharge the capacitor under a constant current, the constant current being made proportional to a constant current that determines the switching time of the transistor.

16. A circuit, comprising:
a power MOS transistor;
a control circuit coupled to the power MOS transistor, the control circuit comprising a first capacitor coupled to a first constant current source; and
a load detection circuit configured to detect the presence of a load in series with the power MOS transistor and to generate a detection signal in response thereto, the load detection circuit having a filtering circuit configured to make the time of generating the detection signal by the load detection circuit dependant on a switching time of the power MOS transistor, the filtering circuit comprising a filter and capacitor coupled to a second constant current source.

* * * * *